United States Patent [19]

Beak

[11] Patent Number: 5,863,106

[45] Date of Patent: Jan. 26, 1999

[54] APPARATUS FOR AFFIXING A PRINTED CIRCUIT BOARD IN A MONITOR CASE

[75] Inventor: Soon-Ki Beak, Suwon, Rep. of Korea

[73] Assignee: Samsung Electronics Co., Ltd., Rep. of Korea

[21] Appl. No.: 941,046

[22] Filed: Sep. 30, 1997

Related U.S. Application Data

[63] Continuation of Ser. No. 562,438, Nov. 28, 1995.

[30] Foreign Application Priority Data

Nov. 28, 1994 [KR] Rep. of Korea ...................... 94-31509

[51] Int. Cl.⁶ .................................................. A47B 81/06
[52] U.S. Cl. ........................ 312/7.2; 312/223.2; 348/836; 361/682
[58] Field of Search ................................ 312/7.2, 223.1, 312/223.2, 263, 265.5; 361/679, 682, 796, 756, 757, 740, 741, 801, 802; 348/836, 839

[56] References Cited

U.S. PATENT DOCUMENTS

| 3,703,323 | 11/1972 | Gallas et al. ............................. 312/7.2 |
| 4,635,809 | 1/1987 | Bachman et al. ..................... 312/7.2 X |
| 4,716,493 | 12/1987 | Zelkowitz ........................... 348/836 X |
| 4,853,790 | 8/1989 | Dickie ..................................... 348/836 |
| 5,033,802 | 7/1991 | Fairbanks ................................. 312/7.2 |
| 5,041,944 | 8/1991 | Campisi .............................. 348/836 X |
| 5,122,928 | 6/1992 | Lo ........................................ 312/7.2 X |
| 5,363,150 | 11/1994 | Kojima ................................ 312/7.2 X |
| 5,575,545 | 11/1996 | Wang ....................................... 312/7.2 |
| 5,682,300 | 10/1997 | Sung .................................... 312/7.2 X |
| 5,699,132 | 12/1997 | Adachi et al. ....................... 312/7.2 X |

FOREIGN PATENT DOCUMENTS

| 851612 | 9/1970 | Canada .................................. 312/7.2 |
| 2554299 | 5/1985 | France ................................... 312/7.2 |
| 3274087 | 12/1991 | Japan ..................................... 361/682 |

Primary Examiner—Peter M. Cuomo
Assistant Examiner—James O. Hansen
Attorney, Agent, or Firm—Banner & Witcoff, Ltd.

[57] ABSTRACT

An apparatus for affixing a printed circuit board within a monitor case assembly includes a first guide mechanism integrally formed on opposing side walls of a front case section, a second guide mechanism integrally formed on two side walls of a second case section and at least one coupling device formed on the front case bottom side wall and aligned with the first guide mechanism. The planes of the components are aligned with each other so that a printed circuit board is securely engaged within grooves formed in the guide mechanisms and locked in position by the coupling device.

11 Claims, 4 Drawing Sheets

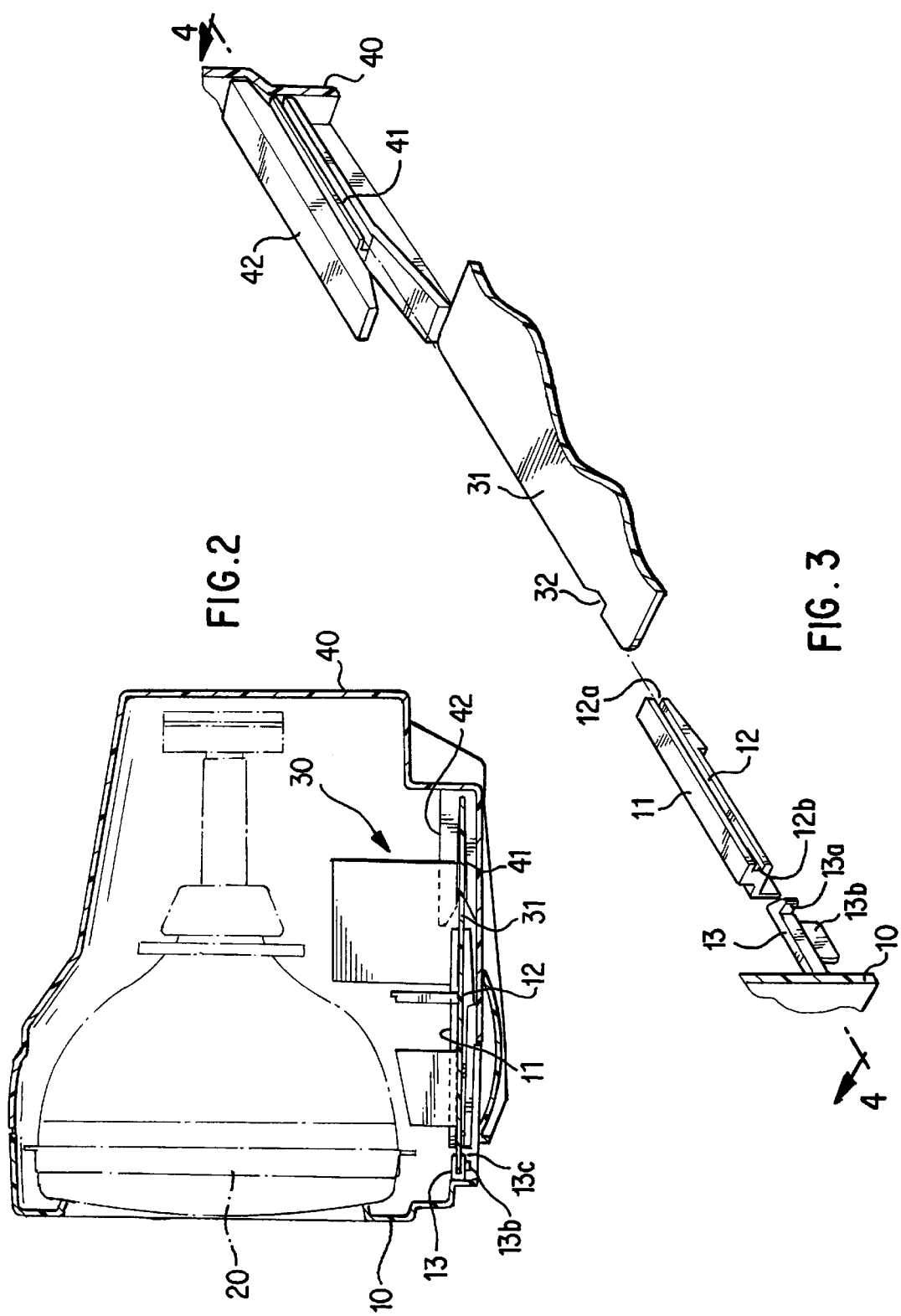

APPARATUS FOR AFFIXING A PRINTED CIRCUIT BOARD IN A MONITOR CASE

This application is a continuation, of application Ser. No. 08/562.438, filed Nov. 28. 1995.

BACKGROUND OF THE INVENTION

The present invention relates to a structure for affixing a printed circuit board within a monitor case, and more particularly, to a fixing apparatus that affixes a printed circuit board (PCB) to the monitor case in a stable manner. Such a fixing apparatus makes it easier to assemble and disassemble the PCB from the monitor case.

The PCB, one of the important components of a monitor, generally is installed in the monitor case under a cathode ray tube, and is protected by the case from the exterior environment. The PCB is firmly attached to a molded frame so as to remain affixed within the monitor case. In a prior art structure which utilizes screws to affix the PCB to the molded frame chassis, several printed circuit boards which mount different electronic components, such as, the main power supply and video generator, are individually mounted on the chassis.

As monitors are designed with more and more improved features, the number of electronic components mounted on the PCB increases, which in turn increases the number of fastening structures. This increase in components and fastening structures causes a number of problems.

For instance, mounting of electronic components on separate PCBs decreases operational function of individual components and thereby reduces product reliability. Among the drawbacks of the prior art structures are a decrease in production yield caused by complicated or inconvenient assembly steps, resulting in increased production costs. In addition, the above-described structure makes the assembly process time consuming and inefficient, and is not amenable to easy disassembly for repair which thus increases the cost of maintenance.

SUMMARY OF THE INVENTION

Therefore, it is an object of the present invention to provide an apparatus for affixing a PCB within a monitor case without using auxiliary fixing apparatus or fastening devices, and still ensuring secure engagement with the monitor case.

It is another object of the present invention to provide a PCB fixing apparatus which allows a monitor case to directly hold and support a PCB. It is still another object of the present invention to provide a PCB fixing apparatus which will achieve higher productivity and save costs by simplifying the assembly and disassembly process steps.

To accomplish the above objects of the present invention, there is provided an apparatus for affixing a PCB to a monitor case comprised of front case and rear case sections. The apparatus includes a first guide mechanism provided on the front case section for securely engaging the front portion of the periphery of a PCB and a second guide mechanism integrally formed on the rear case section to supportedly engage the rear portion of the periphery of the PCB. The apparatus may further include a coupling device formed on the front case section, positioned at the front of the end of first guide mechanism, to engagedly lock the PCB.

The first guide mechanism comprises a pair of guide rails provided on the bottom surface of either corner of the front case section and rail grooves formed in between lower and upper protrusions of each guide rail. The second guide rail mechanism incorporates a pair of ribs integrally formed and extending along the length of the inner surface of either lower side walls of the rear case section.

These and other features and advantages of the invention may be more completely understood from the following detailed description of the preferred embodiment of the invention with reference to the accompanying drawings.

BRIEF DESCRIPTION OF THE DRAWINGS

FIG. 2 is a cross-sectional view of the apparatus of FIG. 1, shown assembled;

FIG. 3 is an exploded perspective partial view of the apparatus in FIG. 1;

DETAILED DESCRIPTION OF THE PREFERRED EMBODIMENTS

Figure 1:
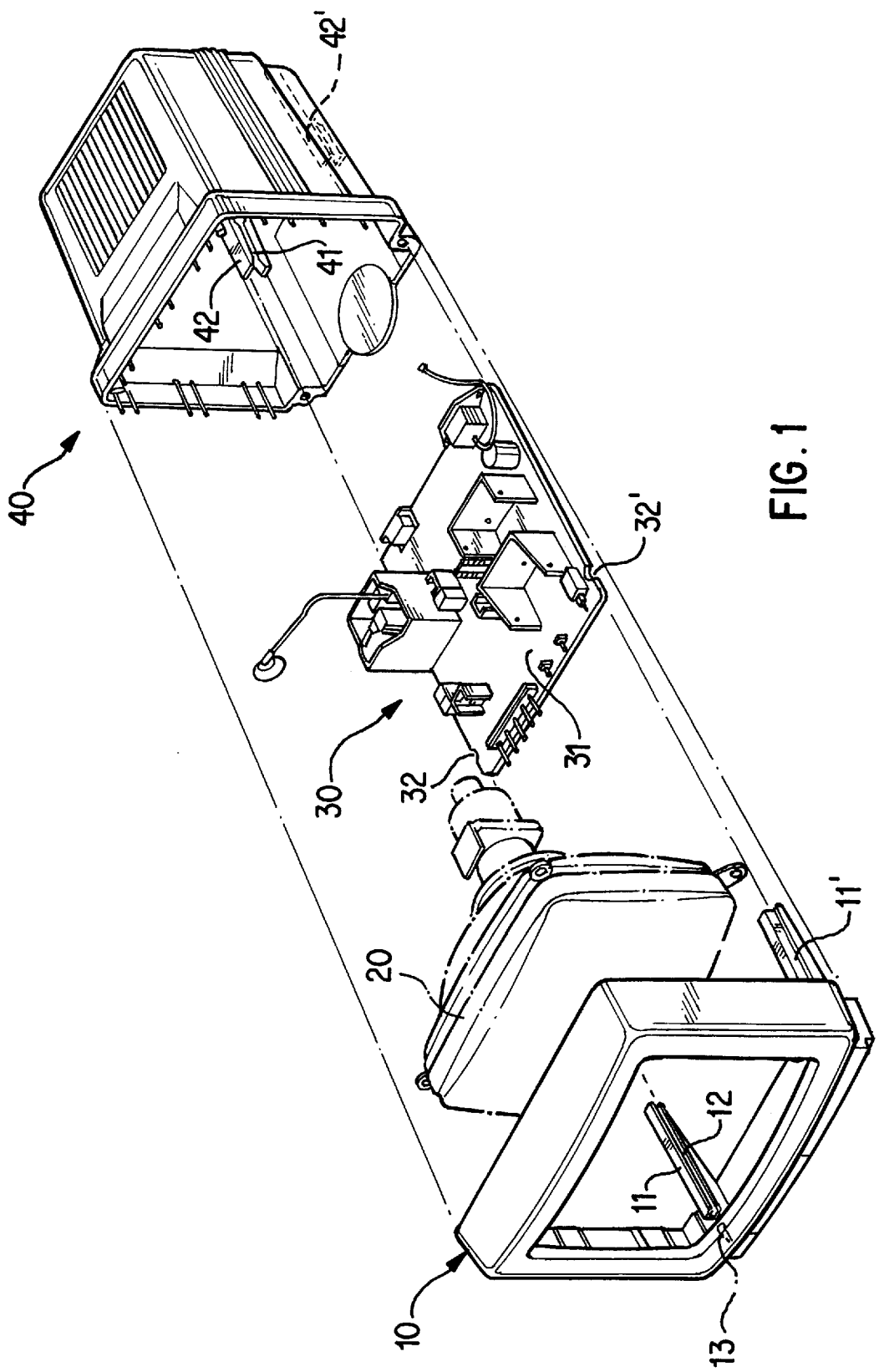
FIG. 1 is an exploded perspective assembly view of an apparatus for affixing a PCB within a monitor case in accordance with a preferred embodiment of the present invention.

Referring to FIG. 1, illustrating an exploded view of the entire monitor assembly, a monitor case is shown which comprises a front case section 10 and a rear case section 40 for housing a cathode ray tube 20 and a PCB 31. In the two bottom corners of both the front case and rear case sections 10 and 40, there is provided a preferred embodiment of a PCB fixing apparatus according to the present invention.

A first guide mechanism provided on both ends of the bottom surface of the front case section comprises of a pair of guide rails 11 and 11'. Guide rails 11 and 11' extend laterally and in a rearward direction from the inner surface of the two bottom corners of the front case section along the length of both side walls, respectively. Guide rail 11 has an elongated rail groove 12 formed in between lower and upper protrusions 12c and 12d and guide rail 11' has a similar elongated groove 12' formed in between similar lower and upper protrusions. The protrusions are spaced a distance which substantially equals the thickness of PCB 31. Rail groove 12 is aligned with the opposing groove 12' and the distance therebetween is substantially equal or slightly wider than the width of PCB 31. The front portion of both side ends of PCB 31 is slidingly inserted into and affixed within rail grooves 12 and 12'.

A coupling device 13, having a hook portion 13a, is located at the front side of one exit end 12b of rail groove 12. An entrance end 12a of rail groove 12 into which PCB 31 is slidingly inserted, in alignment with the axial direction, is located at the opposite end of rail groove 12. A straight vertical tab 13b is also integrally formed at lower end of coupling device 13, and extends downwardly and in a direction perpendicular to the axial direction. An opening 13c is formed on one wall of front case section 10 between the edge portion of hook 13a and exit end 12b so as to allow exterior manual manipulation of vertical tab 13b.

The coupling device 13 has a predetermined elasticity, and is integrally formed on the inner surface of left bottom corner of front case section 10. Coupling device 13 extends as an arm in a direction from front case section 10 toward rear case section 40 and has a free or distal end on which projection 13a is formed. In the illustrated embodiment, a similar coupling device 13' is formed on the inner surface of the right bottom corner of front case section 10. A pair of locking grooves 32 and 32' for receiving and affixing hooks 13a and 13a' of coupling device 13 and 13' respectively are formed at both side ends, and substantially near the forward edge of PCB 31.

A second guide mechanism is integrally formed on respective surfaces of the two bottom corners of rear case section 40 and includes at least a pair of guide ribs 42 and 42'. A guide rib groove 41 is formed in guide rib 42 and a guide rib groove 41' is formed in guide rib 42'. Guide ribs 42 and 42' are opposed to one another with their respective grooves 41 and 41' aligned with one another. Both guide rib grooves 41 and 41' are spaced a distance sufficient for receiving and affixing the rear portion of PCB 31 therein.

To assemble the apparatus configured as described above, PCB 31 is slidingly inserted into and affixed within rail grooves 12 and 12' formed in respective guide rails 11 and 11'. A pushing force is applied until the front edge of PCB 31 comes out of exit groove 12b. In that instance, PCB 31 is guided by rail grooves 12 and 12' and slides along the axial direction thereby traveling in a rectilinear motion to exit groove 12b. Once the front edge portion of the PCB 31 extends out of exit groove 12b, it contacts with the beveled guide surfaces of hooks 13a and 13a' of coupling devices 13 and 13'.

Figure 4:
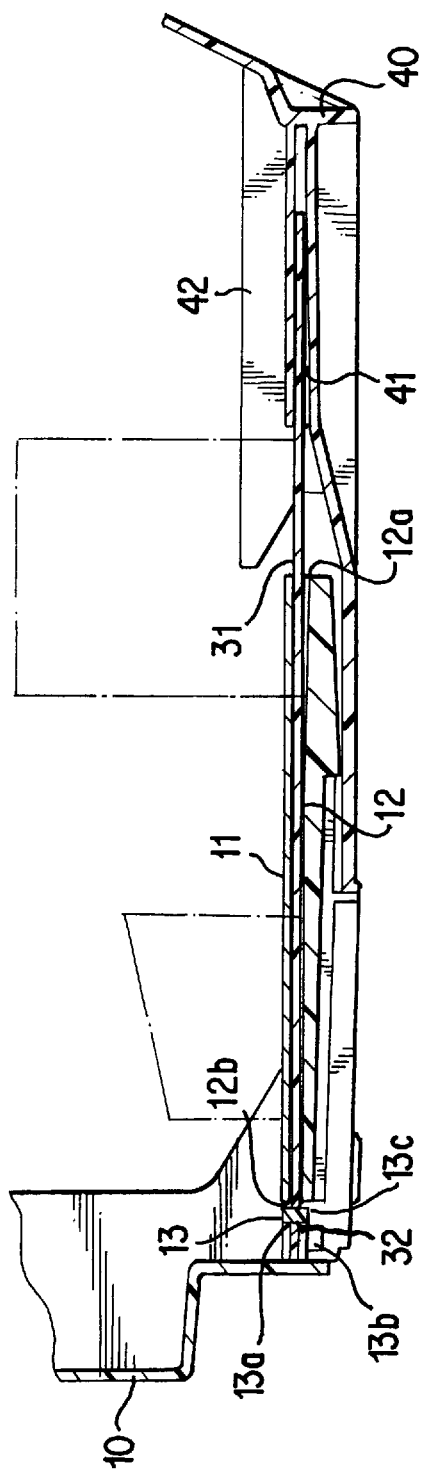
FIG. 4 is a cross-sectional view of the apparatus taken along line 4–4' in FIG. 3 shown-assembled.
Figure 6:
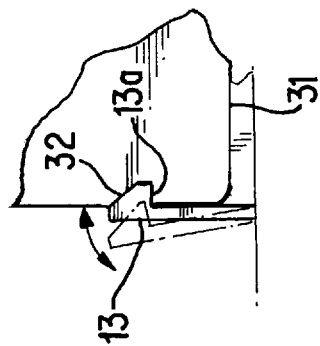
FIG. 6 is an enlarge top plan view of the portion shown in area B of FIG. 5, illustrating alternative positions of a coupling device according to the present invention.
Figure 5:
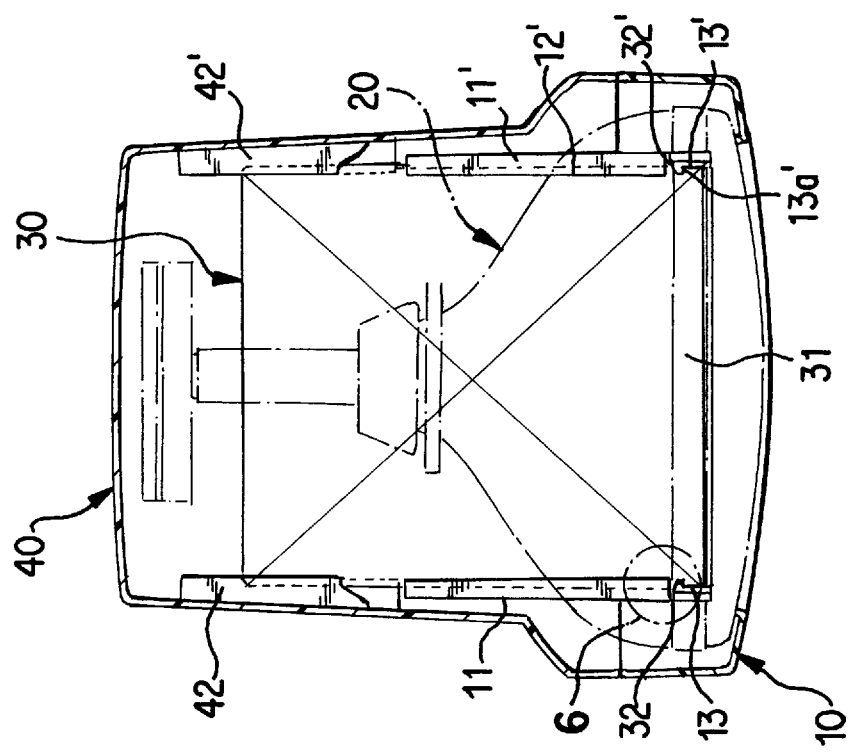
FIG. 5 is a top plan view illustrating a preferred embodiment incorporating an apparatus for affixing a PCB within a monitor case according to the present invention.

A slight push in forward direction forces coupling devices 13 and 13' to flex sufficiently against their elastic bias and allow PCB 31 to move further in the axial direction. PCB 31 is pushed further forward until hook 13a and 13a' are positioned in and in contact with locking grooves 32 and 32' formed in PCB 31. The inherent resilience of the coupling devices cause the hooks 13a and 13a' to move slidingly inside locking grooves 32 and 32' to thereby lockingly engage PCB 31. As shown in FIGS. 2 and 4, when assembled, the horizontal planes of the printed circuit board, the first and second guide mechanisms and the coupling devices are aligned with each other.

This arrangement of coupling devices and locking grooves may be assembled at any one side of PCB 31, rather than on both sides, and various such arrangements are contemplated to within the scope of the present invention. That is, only a single coupling device and locking groove could be used. A combination of the above arrangement may well be configured at a side on which a power switch is installed, when it is not preferred to have a coupling device and locking groove on both sides, since an activating operation of the power switch may cause motion of PCB 31, and locating the coupling device adjacent the power switch would prevent such motion. Upon completion of affixing PCB 31 to front case section 10, rear case section 40 then receives rear portion of PCB 31 within rail grooves 41 and 41' to thereby complete assembly steps.

To disassemble the PCB from the monitor case, the assembly steps discussed above are reversed. Rear case section 40 is first pulled backwardly to dislodge the rear portion of PCB from guide rib grooves 41 and 41' of guide ribs 42 and 42'. Then straight vertical tab 13b located in opening groove 13c is pulled outwardly so as to unfasten hook 13a from an engagement with locking groove 32 of PCB 31.

PCB 31, thus released from the engagement, is pulled out backwardly in the axial direction along rail grooves 12 and 12'. In this preferred embodiment, by way of example, the hook of the coupling device is lockingly engaged in locking groove formed in PCB as an exemplary and preferred means for affixing PCB to front case section. However, various modified means for preventing PCB from unfastening may be alternatively contemplated by known methods.

As with the preferred embodiment discussed above, a printed circuit board on which a variety of electronic component are mounted is affixed and assembled to a monitor case assembly without using any auxiliary device or fastening device such as, for instance, a screw. The apparatus disclosed in the embodiment is configured in simple structure which is integral with the case assembly and which securely supports a PCB in such a manner that both sides of the PCB are completely inserted and engagedly sustained by the grooves formed in the guide rails and guide ribs, thereby preventing deformation and sagging of the PCB. Such a configuration as described above enables a simplified assembly and disassembly process which is time efficient, thereby facilitating productivity and cost savings.

From the foregoing detailed description, it will be evident that there are a number of changes, adaptations, and modifications of the present invention which come within the province of those skilled in the art. However, it is intended that all such variations not departing from the spirit of the invention be considered as within the scope thereof as limited solely by the claims appended hereto.

I claim:

1. An apparatus for affixing a printed circuit board within a monitor case for housing and supporting a cathode ray tube, the monitor case comprising a front case section having a screen opening for viewing the screen of the tube and a rear case section attached to the front case section and adapted to house the cathode ray tube, said apparatus comprising:

first guide means integrally formed and provided on both end surfaces of a bottom wall of said front case section for receiving and affixing opposite sides of a front portion of the printed circuit board;

second guide means integrally formed on at least two walls of the rear case section for receiving and securing opposite sides of a rear portion of the printed circuit board;

a snapping device provided on at least one end side of an inner surface of said bottom wall of said front case section, for engagedly locking printed circuit board, said snapping device protrudingly extending from said bottom wall in a rearward direction from said front case section; and wherein said snapping device has a predetermined elasticity and a distal end, and includes a hook shaped locking portion at said distal end, said locking portion being adjacent to an exit groove formed in said first guide means and facing inwardly of said monitor case.

2. The apparatus of claim 1, further comprising a plate formed on lower portion of said snapping device and located to extend into an opening formed in said front case section.

3. The apparatus of claim 1, wherein said first guide means comprises a pair of aligned guide rails and a guide groove formed in between each of said guide rails, whereby both side ends of a printed circuit board are capable of being slidingly inserted into said guide grooves and engagedly affixed to said first case section.

4. The apparatus of claim 1, wherein said second guide means comprises a pair of aligned ribs integrally formed with said rear case section.

5. The apparatus of claim 1, wherein planes of said printed circuit board, said first guide means, said second guide means and said snapping device are aligned with each other.

6. A monitor case for housing a cathode ray tube with an apparatus for affixing a printed circuit board, the monitor case comprising:

a front case section having a screen opening for viewing a screen of the cathode ray tube;

a rear case section removably connected to said front case section;

a first guide rail extending rearward from inside of a first lower corner of said front case section and having a first guide rail groove for slidingly receiving a first front side edge of the printed circuit board;

a second guide rail extending rearward from inside of a second lower corner of said front case section and having a second guide rail groove for slidingly receiving a second front side edge of the printed circuit board;

a first guide rib extending forward from inside of a first lower corner of said rear case section and having a first guide rib groove for receiving a first rear side edge of the printed circuit board;

a second guide rib extending forward from inside of a second lower corner of said rear case section and having a guide rib groove for receiving a second rear side edge of the printed circuit board;

a snapping device located adjacent one of said guide rails for locking the printed circuit board in position within said guide rail grooves; and wherein said snapping device includes an elastic arm extending rearward from at least one of a plurality of front lower corners of said front case section and having a hooked shaped locking portion at a distal end of said arm for lockingly engaging the printed circuit board.

7. The monitor case of claim 6 wherein said arm includes an actuating tab extending outward from said arm and through an access opening formed through said front case section wherein movement of said actuating tab moves said elastic arm against its elastic bias so that said hook shaped locking portion is capable of being moved relative to the printed circuit board.

8. The monitor case of claim 7, wherein said actuating tab extends downward.

9. The monitor case of claim 6, wherein said snapping device includes one of said elastic arms extending from each of said front lower corners of said front case section.

10. The monitor case of claim 6, wherein each of said guide rails is formed integral with said front case section.

11. The monitor case of claim 6, wherein each of said guide ribs is formed integral with said rear case section.

* * * * *